US012424268B2

(12) United States Patent
Ji

(10) Patent No.: US 12,424,268 B2
(45) Date of Patent: Sep. 23, 2025

(54) MEMORY AND OPERATING METHOD THEREFOR

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 211 days.

(21) Appl. No.: 18/157,059

(22) Filed: Jan. 19, 2023

(65) Prior Publication Data

US 2024/0096399 A1 Mar. 21, 2024

(30) Foreign Application Priority Data

Sep. 15, 2022 (CN) ......................... 202211124337.4

(51) Int. Cl.
*G11C 11/4091* (2006.01)
*G11C 11/408* (2006.01)
*G11C 11/4096* (2006.01)

(52) U.S. Cl.
CPC ...... *G11C 11/4091* (2013.01); *G11C 11/4087* (2013.01); *G11C 11/4096* (2013.01)

(58) Field of Classification Search
CPC ............ G11C 11/4091; G11C 11/4087; G11C 11/4096; G11C 5/025; G11C 16/26; G11C 16/0483
See application file for complete search history.

(56) References Cited

U.S. PATENT DOCUMENTS

| | | | | |
|---|---|---|---|---|
| 2008/0037318 A1 | 2/2008 | Hidaka | | |
| 2019/0333547 A1* | 10/2019 | Ka | ......................... | G11C 5/025 |
| 2020/0402587 A1 | 12/2020 | Chibvongodze et al. | | |

FOREIGN PATENT DOCUMENTS

| | | | |
|---|---|---|---|
| CN | 110415743 | A | 11/2019 |
| CN | 110580933 | A | 12/2019 |
| CN | 112102865 | A | 12/2020 |
| TW | 579518 | B | 3/2004 |
| TW | I480870 | B | 4/2015 |

OTHER PUBLICATIONS

US office action in U.S. Appl. No. 18/169,167, mailed on Oct. 24, 2024.
CN first office action in application No. 202211124337.4, mailed on Oct. 17, 2024.

* cited by examiner

*Primary Examiner* — Amir Zarabian
*Assistant Examiner* — Bradley S Coon
(74) *Attorney, Agent, or Firm* — SYNCODA LLC; Feng Ma

(57) ABSTRACT

A memory includes: a memory cell array; a first column decoder, coupled to the memory cell array and configured to perform a write operation on the memory cell array; a second column decoder, coupled to the memory cell array and configured to perform a read operation on the memory cell array; and a read amplifier, the read amplifier and the second column decoder being located on two opposite sides of the memory cell array, the read amplifier being coupled to the memory cell array and configured to receive read data information output by the memory cell array based on the read operation. The read amplifier, the first column decoder, the memory cell array and the second column decoder are arranged in a first direction, and the first column decoder and the second column decoder are located on two opposite sides of the memory cell array.

12 Claims, 5 Drawing Sheets

MEMORY AND OPERATING METHOD THEREFOR

CROSS-REFERENCE TO RELATED APPLICATION

This application claims priority to Chinese Patent Application No. 202211124337.4, filed on Sep. 15, 2022, the disclosure of which is hereby incorporated by reference in its entirety.

BACKGROUND

A Dynamic Random Access Memory (DRAM) includes memory cells arranged in an array, and each of the memory cells includes a transistor and a capacitor. The DRAM is widely used in electronic devices such as a mobile device and a computer. With development of manufacturing process techniques, the capacity of the DRAM is gradually increased. However, in an operating process of the memory, there are read errors. Therefore, how to improve the read accuracy of the memory has become an urgent problem to be solved.

SUMMARY

The disclosure relates to the technical field of semiconductors, in particular to a memory and an operating method therefor.

According to a first aspect of embodiments of the disclosure, a memory is provided, which may include a memory cell array, a first column decoder, a second column decoder and a read amplifier.

The first column decoder is coupled to the memory cell array and configured to perform a write operation on the memory cell array.

The second column decoder is coupled to the memory cell array and configured to perform a read operation on the memory cell array.

The read amplifier and the second column decoder are located on two opposite sides of the memory cell array. The read amplifier is coupled to the memory cell array and configured to receive read data information output by the memory cell array based on the read operation.

The read amplifier, the first column decoder, the memory cell array and the second column decoder are arranged in a first direction, and the first column decoder and the second column decoder are located on two opposite sides of the memory cell array.

According to a second aspect of the embodiments of the disclosure, an operating method for a memory is provided. The memory may include a memory cell array, a first column decoder, a second column decoder and a read amplifier. The read amplifier, the first column decoder, the memory cell array and the second column decoder are arranged in a first direction, and the first column decoder and the second column decoder are located on two opposite sides of the memory cell array.

The operating method may include the following operations.

In a case where a write operation is performed, the write operation is performed on the memory cell array by the first column decoder.

In a case where a read operation is performed, the read operation is performed on the memory cell array by the second column decoder.

The read amplifier receives read data information output by the memory cell array based on the read operation. The read amplifier and the second column decoder are located on two opposite sides of the memory cell array.

In the memory provided by the embodiments of the disclosure, the first column decoder is coupled to the memory cell array and performs the write operation on the memory cell array. The second column decoder is coupled to the memory cell array and performs the read operation on the memory cell array. The read amplifier and the second column decoder for performing the read operation are located on the two opposite sides of the memory cell array. Since the read amplifier and the second column decoder are located on the two opposite sides of the memory cell array, when data information of the memory cells at different positions is read and transmitted to the read amplifier respectively by means of the second column decoder, the above processes take approximately the same or even the same time, and the slack for receiving the data information by the subsequent circuit may be increased, thereby reducing the read errors and improving the performance of the memory.

DETAILED DESCRIPTION

The technical solutions of the disclosure will be further described below in combination with the drawings and specific embodiments.

In the embodiments of the disclosure, terms such as "first" and "second" are used for distinguishing similar objects rather than describing a specific sequence or order.

In the embodiments of the disclosure, the term "A is in contact with B" includes a condition that A is in direct contact with B or a condition that other components are interposed between A and B and A is indirectly contacted with B.

In the embodiments of the disclosure, the term "layer" refers to a material part of an area having a thickness. The layer may extend the overall structure below or above the layer or may have a range smaller than a range of the structure below or above the layer. In addition, the layer may be an area of a homogenous or nonhomogenous continuous structure with a thickness smaller than the thickness of a continuous structure. For example, the layer may be located between a top surface and a bottom surface of the continuous structure or the layer may be located between any horizontal planes corresponding to the top surface and the bottom surface of the continuous structure. The layer may extend horizontally and perpendicularly and/or along an inclined surface. Furthermore, the layer may include a plurality of sub-layers.

It is to be understood that the meaning of the terms "on", "above" and "over" in the disclosure shall be read in the broadest manner, so that the term "on" not only represents that it is "on" a certain object and has no intermediate feature or layer (i.e., directly on the certain object), but also further represents that it is "on" the certain object and has the intermediate feature or layer.

Figure 1:
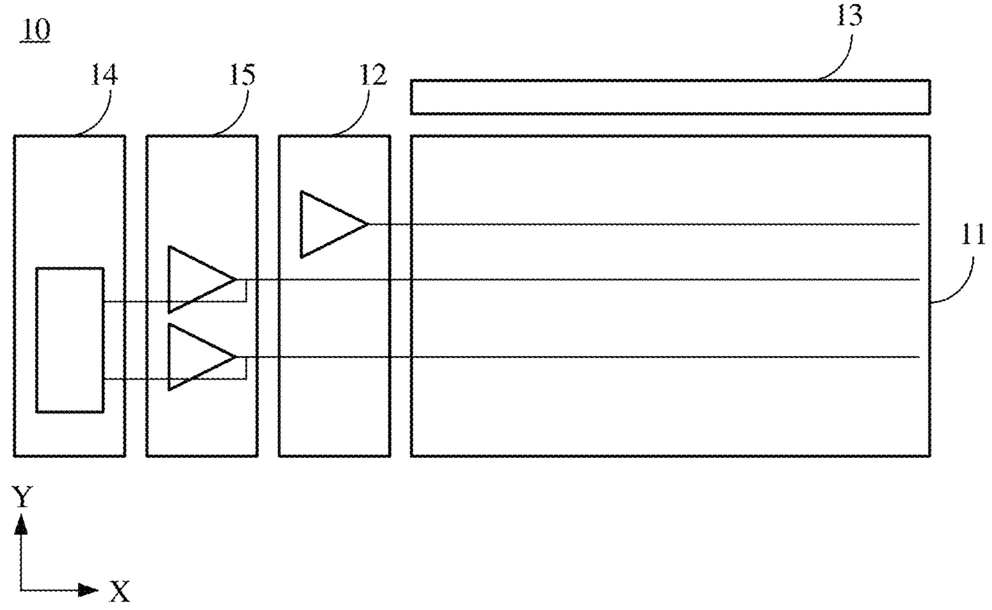
FIG. 1 is a schematic structural diagram of a memory according to an exemplary embodiment.

FIG. 1 is a schematic structural diagram of a memory according to an exemplary embodiment. As shown in FIG. 1, the memory 10 includes a memory cell array 11, a column decoder 12, a row decoder 13, a read amplifier 14 and a write driver 15 that are coupled to the memory cell array 11. The read amplifier 14, the write driver 15, the column decoder 12 and the memory cell array 11 are arranged in sequence along a positive X axis direction, and the row decoder 13 and the memory cell array 11 are arranged in sequence along a Y axis direction.

Figure 2:
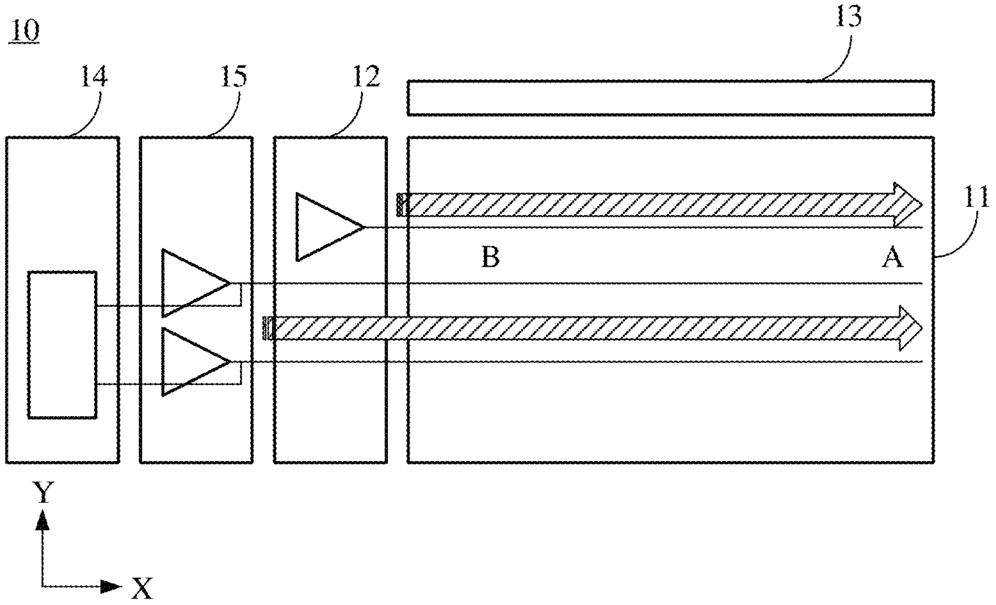
FIG. 2 is a schematic diagram of a write operation of a memory according to FIG. 1.

Referring to FIG. 2, FIG. 2 is a schematic diagram of a write operation of a memory according to FIG. 1. The write driver 15 transmits a data signal to be written to the memory cell array 11 according to a received write operation command. The column decoder 12 transmits the column selection signal to the memory cell array 11 along the positive X axis direction to select the memory cell column, on which the write operation is performed, in the memory cell array 11. As shown in FIG. 2, when the write operation is performed on the memory cell array 11, the column decoder 12 and the write driver 15 both transmit the column selection signal and the data signal to be written to the memory cell array 11 along a same direction (e.g., the positive X axis direction in FIG. 2). Therefore, when the write operation is performed on the storage cell (e.g., A in FIG. 2) of the storage cell array 11 relatively away from the column decoder 12 and the write driver 15, timing of the column selection signal and the data signal to be written for the storage cell A shown in FIG. 2 may be kept substantially consistent. Similarly, when the write operation is performed on the memory cell (e.g., B in FIG. 2) of the memory cell array 11 relatively away from the column decoder 12 and the write driver 15, timing of the column selection signal and the data signal to be written for the memory cell B shown in FIG. 2 may be kept substantially consistent.

Figure 3:
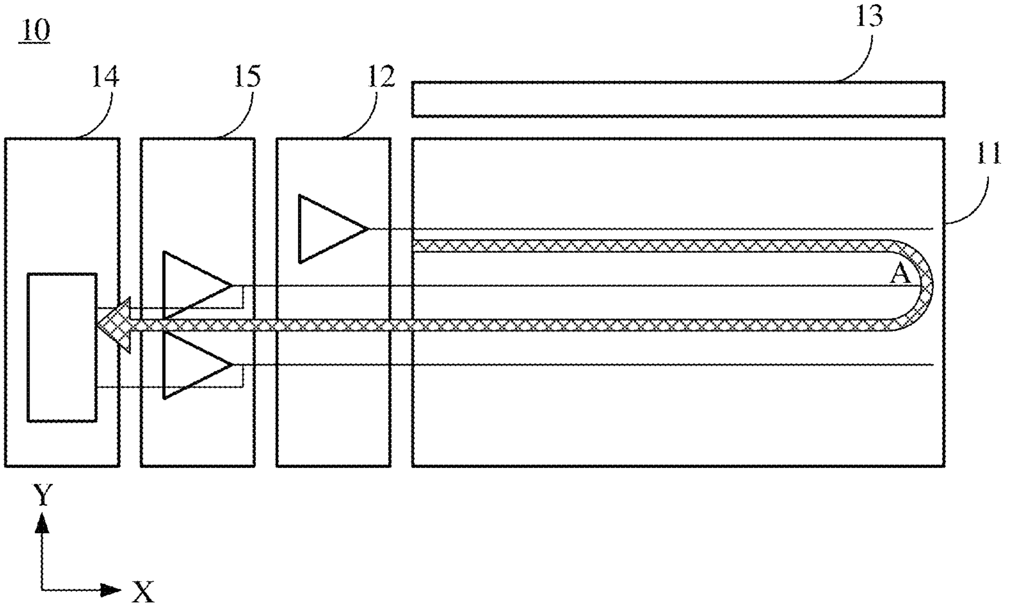
FIG. 3 is a schematic diagram of a read operation of a memory according to FIG. 1.

Referring to FIG. 3, FIG. 3 is a schematic diagram of a read operation of a memory according to FIG. 1. As shown in FIG. 3, when the read operation is performed on the memory cell array 11, for example, the read operation is performed on the memory cell (e.g., A in FIG. 3) of the memory cell array 11 relatively away from the column decoder 12 and the write driver 15. Specifically, the signal line with an arrow in FIG. 3 illustrates a process that the column decoder 12 transmits the column selection signal to the memory cell A along the positive X axis direction, and the memory cell A outputs read data to the read amplifier 14 along a direction opposite to the positive X axis direction according to the column selection signal.

Figure 4:
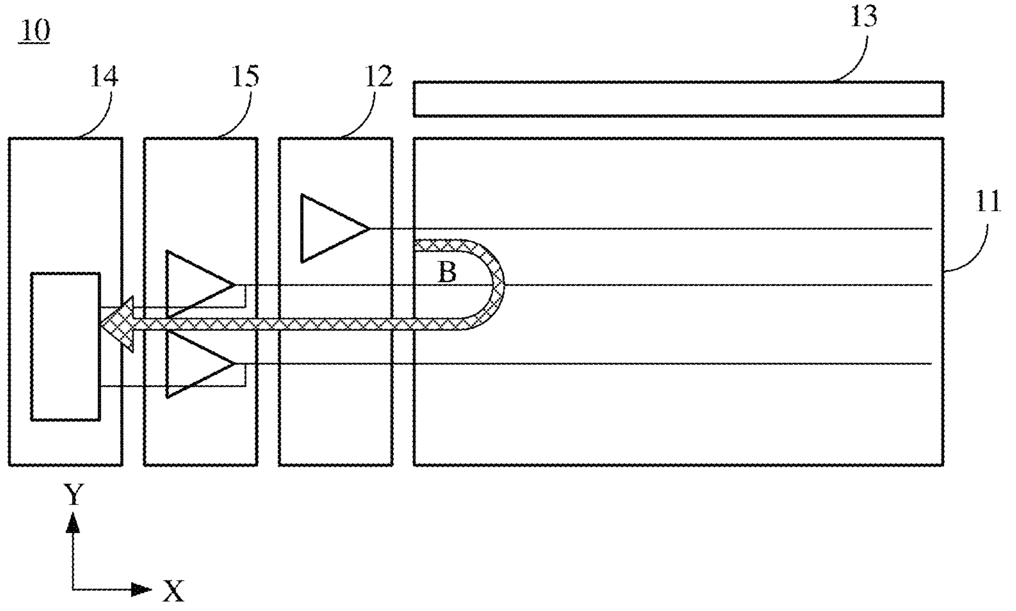
FIG. 4 is another schematic diagram of a read operation of a memory according to FIG. 1.

Referring to FIG. 4, FIG. 4 is another schematic diagram of a read operation of a memory according to FIG. 1. As shown in FIG. 4, when the read operation is performed on the memory cell array 11, for example, the read operation is performed on the memory cell (e.g., B in FIG. 4) of the memory cell array 11 relatively close to the column decoder 12 and the write driver 15. Specifically, the signal line with an arrow in FIG. 4 illustrates a process that the column decoder 12 transmits the column selection signal to the memory cell B along the positive X axis direction, and the memory cell B outputs read data to the read amplifier 14 along a direction opposite to the positive X axis direction according to the column selection signal.

Referring to FIG. 3 and FIG. 4, when the read operation is performed on the memory cell array 11, for the memory cell A and the memory cell B with different distances from the column decoder 12 and the write driver 15 in the memory cell array 11, there is a difference in time consumption between the processes of outputting the read data to the read amplifier 14. For example, the memory cell A consumes a longer time than the memory cell B. When the memory cells at different positions respectively output data information to the read amplifier, the times taken for the above processes are different, such that the time margin for receiving the data information by the subsequent circuit is reduced, resulting in the read errors.

In view of this, the embodiments of the disclosure provide another memory.

Figure 5A:
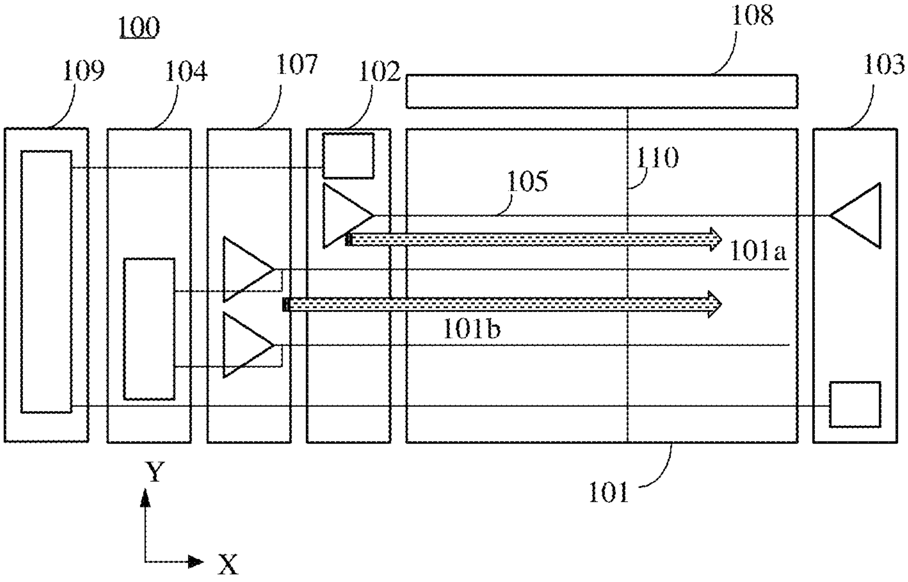
FIG. 5A is a schematic diagram of a write operation of a memory according to an embodiment of the disclosure.
Figure 5B:
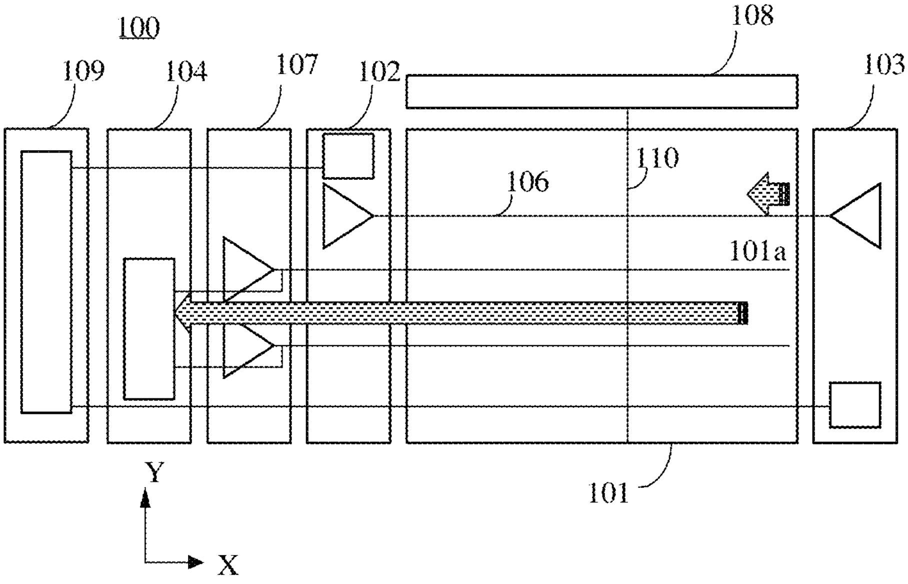
FIG. 5B is a schematic diagram of a read operation of a memory according to an embodiment of the disclosure.

Referring to FIGS. 5A and 5B, FIG. 5A is a schematic diagram of a write operation of a memory according to an embodiment of the disclosure. FIG. 5B is a schematic diagram of a read operation of a memory according to an embodiment of the disclosure. As shown in FIGS. 5A and 5B, the memory 100 includes a memory cell array 101, a first column decoder 102, a second column decoder 103 and a read amplifier 104.

The first column decoder 102 is coupled to the memory cell array 101 and is configured to perform a write operation on the memory cell array 101.

The second column decoder 103 is coupled to the memory cell array 101 and is configured to perform a read operation on the memory cell array 101.

The read amplifier 104 and the second column decoder 103 are located on two opposite sides of the memory cell array 101, the read amplifier is coupled to the memory cell array 101 and is configured to receive read data information outputted by the memory cell array 101 based on the read operation.

The read amplifier 104, the first column decoder 102, the memory cell array 101 and the second column decoder 103 are arranged in a first direction, and the first column decoder 102 and the second column decoder 103 are located on two opposite sides of the memory cell array 101.

Figure 6:
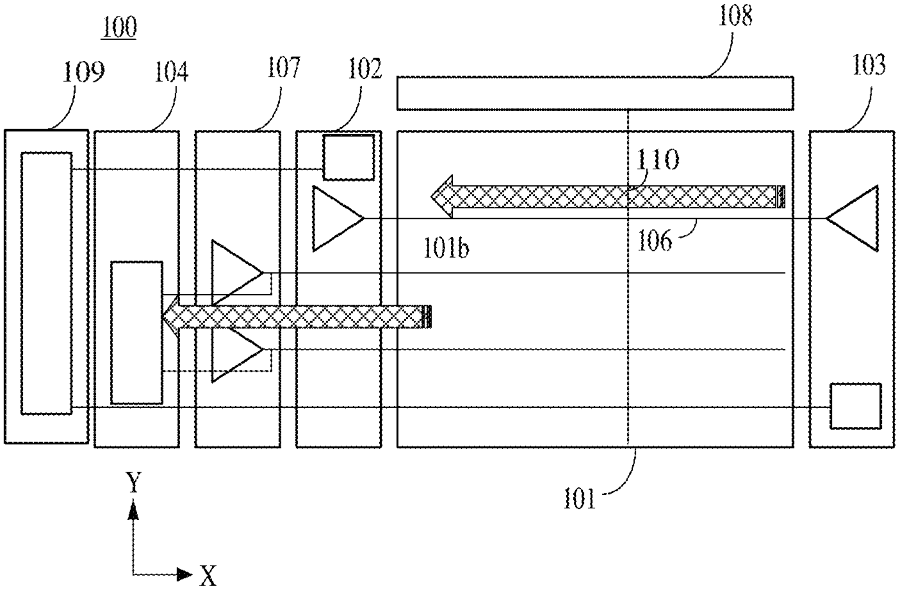
FIG. 6 is another schematic diagram of a read operation of a memory according to an embodiment of the disclosure.

It is to be noted that the memory 100 includes the memory cell array 101, the first column decoder 102, the second column decoder 103 and the read amplifier 104. The embodiments are illustrated by taking a condition that the read amplifier 104, the first column decoder 102, the memory cell array 101 and the second column decoder 103 shown in FIGS. 5A and 5B and FIG. 6 are sequentially arranged in the first direction as an example. In addition, the order of the read amplifier 104, the first column decoder 102, the memory cell array 101 and the second column decoder 103 may be changed, which is not limited in the embodiments. The first column decoder 102, the read amplifier 104, the memory cell array 101 and the second column decoder 103 are sequentially arranged in the first direction or arranged along other directions, which may also realize the disclosure.

Exemplarily, the memory 100 may include the first column decoder 102 and the second column decoder 103, and the first column decoder 102 and the second column decoder 103 drive the memory cell array 101 in two directions (for example, in the opposite directions). As shown in FIGS. 5A and 5B, the first column decoder 102 and the second column decoder 103 may be respectively located on two sides of the memory cell array 101, the first column decoder 102 drives the memory cell array 101 along the positive X axis direction and the second column decoder 103 drives the memory cell array 101 along a direction opposite to the positive X axis direction.

When a write operation command is received, the write operation is performed on the memory cell array 101 by means of the first column decoder 102. As shown in FIG. 5A, when the write operation is performed on the memory cell array 101, since the first column decoder 102 and the write driver 107 both transmit the column selection signal and the data signal to be written to the memory cell array 101 along a same direction (e.g., the positive X axis direction in FIG. 5A), in a write process shown in FIG. 5A, timing of the column selection signal and the data signal to be written may be kept substantially consistent, thereby improving the consistency of the write operation.

Exemplarily, an input column address obtained by decoding the write operation command is transmitted to the first column decoder 102. The first column decoder 102 may decode the input column address and may generate the first column selection signal based on a decoding result. The first column decoder 102 may transmit the first column selection signal along the positive X axis direction, so as to select the memory cell corresponding to the input column address to perform the write operation.

In an example, in a case where a read operation command is received, the read operation is performed on the memory cell array 101 by means of the second column decoder 103. As shown in FIG. 5B, the read operation is performed on the memory cell 101*a* of the memory cell array 101 relatively close to the second column decoder 103. Specifically, the signal line with an arrow in FIG. 5B illustrates that the second column decoder 103 transmits a second column selection signal to the memory cell 101*a* along the direction (the negative X axis direction) opposite to the positive X axis direction, and the memory cell 101*a* outputs read data to the read amplifier 104 along the direction (the negative X axis direction) opposite to the positive X axis direction according to the second column selection signal.

In another example, referring to FIG. 6, FIG. 6 is another schematic diagram of a read operation of a memory according to FIG. 5B. As shown in FIG. 6, the read operation is performed on the memory cell 101*b* of the memory cell array 101 relatively away from the second column decoder 103. Specifically, the signal line with an arrow in FIG. 6 illustrates that the second column decoder 103 transmits a second column selection signal to the memory cell 101*b* along the direction (the negative X axis direction) opposite to the positive X axis direction, and the memory cell 101*b* outputs read data to the read amplifier 104 along the direction (the negative X axis direction) opposite to the positive X axis direction according to the second column selection signal.

Exemplarily, an input column address obtained by decoding the read operation command is transmitted to the second column decoder 103. The second column decoder 103 may decode the input column address and may generate the second column selection signal based on a decoding result. Referring to FIG. 5B, the second column decoder 103 may transmit the second column selection signal along the direction (the negative X axis direction) opposite to the positive X axis direction, so as to select the memory cell column corresponding to the input column address, and the read operation is performed on the memory cell 101*a* determined according to the memory cell column in combination with the memory cell row corresponding to an input row address. Referring to FIG. 6, the second column decoder 103 may transmit the second column selection signal along the direction (the negative X axis direction) opposite to the positive X axis direction, so as to select the memory cell column corresponding to the input column address, and the read operation is performed on the memory cell 101*b* determined according to the memory cell column in combination with the memory cell row corresponding to an input row address.

Referring to FIG. 5B and FIG. 6, in a case where the read operation is performed on the memory cell array 101, for the memory cell 101*a* and the memory cell 101*b* with different distances from the second column decoder 103 in the memory cell array 101, the times taken for the processes of outputting read data to the read amplifier 104 are substantially the same. Therefore, when data information of the memory cells at different positions is read and transmitted to the read amplifier respectively by means of the second column decoder 103, the above processes take approximately the same or even the same time, and the slack for receiving the data information by the subsequent circuit may be increased, thereby improving the read accuracy of the data information.

In the memory provided by the embodiments of the disclosure, the first column decoder 102 is coupled to the memory cell array 101 to perform the write operation on the memory cell array 101. The second column decoder 103 is coupled to the memory cell array 101 to perform the read operation on the memory cell array 101. The read amplifier 104 and the second column decoder 103 for performing the read operation are located on the two opposite sides of the memory cell array 101. Since the read amplifier 104 and the second column decoder 103 are located on the two opposite sides of the memory cell array, when data information of the memory cells at different positions is read and transmitted to the read amplifier 104 respectively by means of the second column decoder 103, the above processes take approximately the same or even the same time, so as to avoid the read errors caused due to the reduced slack for receiving the data information by the subsequent circuit, thereby improving the performance of the memory.

In some embodiments, the memory further includes a command decoder 109.

The command decoder 109 is coupled to the first column decoder 102 and is configured to control the first column decoder 102 to perform the write operation according to a received write operation command.

The command decoder 109 is coupled to the second column decoder 103 and is further configured to control the second column decoder 103 to perform the read operation according to a received read operation command.

Exemplarily, in response to a command (CMD) and an address (ADD) received from the external of the memory 100, the command (CMD) decoder (not shown) may control the first column decoder 102, the second column decoder 103 and the row decoder 108.

In an example, in response to the write operation command, the command decoder 109 may control the first column decoder 102, and may transmit the input column address to the first column decoder 102. Therefore, the first column decoder 102 may also be referred to as a "write operation column decoder". In another example, in response to the read operation command, the command decoder 109 may control the second column decoder 103, and may transmit the input column address to the second column decoder 103. Therefore, the second column decoder 103 may also be referred to as a "read operation column decoder".

In an exemplary embodiment, in response to an activation command, a precharging command, a refresh command or the like, the command decoder 109 may control the row decoder 108, and may transmit the input row address to the row decoder 108.

In the memory provided by the embodiments of the disclosure, an additional read operation decoding circuit, i.e., the second column decoder 103, is added to one side of the memory cell array 101, and the command decoder 109 controls the first column decoder 102 to perform the write operation and controls the second column decoder 103 to perform the read operation. As shown in FIG. 5B and FIG. 6, when the read operation is performed on the memory cell array 101, the processes that the memory cell 101*a* and the memory cell 101*b* respectively output the data information to the read amplifier 104 take approximately the same and even the same time, so that the consistency of the read operation is further improved.

In some embodiments, the memory further includes a first column selection line 105 and a second column selection line 106.

The first column selection line 105 is coupled to the first column decoder 102 and the memory cell array 101 and is configured to transmit a first column selection signal to the memory cell array 101 in the first direction. The first column selection signal is used to select a memory cell column in the memory cell array 101 for performing the write operation.

The second column selection line 106 is coupled to the second column decoder 103 and the memory cell array 101 and is configured to transmit a second column selection signal to the memory cell array 101 in a second direction opposite to the first direction. The second column selection signal is used to select a memory cell column in the memory cell array 101 for performing the read operation.

Exemplarily, the column selection signals may be generated by the first column decoder 102 and the second column decoder 103. In an example, referring to FIG. 5A, the first column decoder 102 may decode an input column address and may generate the first column selection signal based on a decoding result. The first column decoder 102 may transmit the first column selection signal in the first direction (the positive X axis direction shown in FIG. 5A) by means of the first column selection line 105, so as to select the memory cell column corresponding to the input column address. The first column decoder 102 may drive, select or activate the first column selection line 105 along the positive X axis direction. The number of the first column selection lines may be one or more. Each of the first column selection lines 105 may be connected with at least one bit line.

In another example, referring to FIG. 6, the second column decoder 103 may decode an input column address and may generate the second column selection signal based on a decoding result. The second column decoder 103 may transmit the second column selection signal in the second direction (the negative X axis direction shown in FIG. 6) by means of the second column selection line 106, so as to select the memory cell column corresponding to the input column address. The second column decoder 103 may drive, select or activate the second column selection line 106 along the negative X axis direction. The number of the second column selection lines may be one or more. Each of the second column selection lines 106 may be connected with at least one bit line.

In an exemplary embodiment, the column selection signals may be generated by the command decoder. For example, the command decoder may, in response to the write operation command, generate the first column selection signal, and transmit the first column selection signal to the first column decoder 102. The command decoder also may, in response to the read operation command, generate the second column selection signal and transmit the second column selection signal to the second column decoder 103.

It is to be noted that referring to FIGS. 5A and 5B and FIG. 6, the first column selection line 105 and the second column selection line 106 may be the same column selection line, and the column selection signals are respectively transmitted by means of the same column selection line during the read operation or the write operation.

In some embodiments, the memory cell array 101 may include a first target memory cell 101*a* and a second target memory cell 101*b* located in a same column. The first target memory cell 101*a* is closer to the second column decoder 103 than the second target memory cell 101*b*.

The second column decoder 103 is configured to transmit the second column selection signal, to select the first target memory cell 101*a* and the second target memory cell 101*b* to perform the read operation.

The first target memory cell 101*a* is configured to, during a first read period, output first read data to the read amplifier 104 according to the second column selection signal.

The read amplifier 104 is further configured to receive the first read data after a first read time since the second column decoder 103 transmits the second column selection signal.

The second target memory cell 101*b* is configured to, during a second read period, output second read data to the read amplifier 104 according to the second column selection signal.

The read amplifier 104 is further configured to receive the second read data after a second read time since the second column decoder 103 transmits the second column selection signal.

The first read time and the second read time are the same.

Referring to FIGS. 5A and 5B and FIG. 6, the memory cell array 101 includes the first target memory cell 101*a* and the second target memory cell 101*b* located in a same column, and the first target memory cell 101*a* is closer to the second column decoder 103 than the second target memory cell 101*b*.

Figure 7:
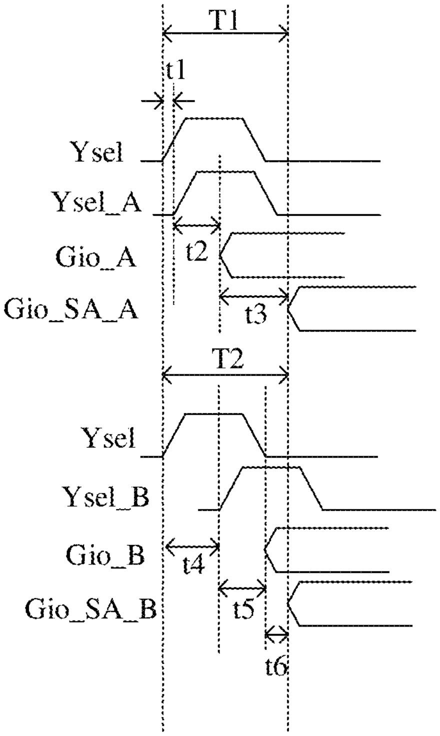
FIG. 7 is a schematic timing diagram of a read operation of a memory according to an embodiment of the disclosure.

Referring to FIG. 5B and FIG. 7, the second column decoder 103 transmits the second column selection signal Ysel, which is transmitted to the first target memory cell 101*a* after the time t1. The first target memory cell 101*a* receives the second column selection signal (e.g., Ysel_A in FIG. 7) and outputs stored first read data Gio_A after the time t2. The first read data Gio_A is transmitted to the read amplifier 104 after the time t3. The read amplifier 104 receives the first read data (e.g., Gio_SA_A in FIG. 7).

Exemplarily, referring to FIG. 7, the read amplifier 104 receives the first read data after the first read time T1 since the second column decoder 103 transmits the second column selection signal. The first read time $T1=t1+t2+t3$.

Referring to FIG. 6 and FIG. 7, the second column decoder 103 transmits the second column selection signal Ysel, which is transmitted to the second target memory cell 101*b* after the time t4. The second target memory cell 101*b* receives the second column selection signal (e.g., Ysel_B in FIG. 7) and outputs stored second read data Gio_B after the time t5. The second read data Gio_B is transmitted to the read amplifier 104 after the time t6. The read amplifier 104 receives the second read data (e.g., Gio_SA_B in FIG. 7).

Exemplarily, referring to FIG. 7, the read amplifier 104 receives the second read data after the second read time T2 since the second column decoder 103 transmits the second column selection signal. The second read time T2=t4+t5+t6.

Referring to FIG. 5A to FIG. 7, when the read operation is performed on the memory cell array 101, the first target memory cell 101*a* and the second target memory cell 101*b* respectively output the read data to the read amplifier 104. The first read time T1 and the second read time T2 are the same. In the memory provided by the embodiments of the disclosure, even if the read operation is performed on different memory cells, the read times are the same, so as to avoid the read errors caused due to the reduced slack for receiving the data information by the subsequent circuit, thereby improving the consistency of the read operation and further improving the performance of the memory.

In some embodiments, the memory further includes a write driver 107.

The write driver 107 and the first column decoder 102 are located on the same side of the memory cell array 101, and the write driver is configured to transmit a data signal to be written to the memory cell array 101 according to a received write operation command.

Referring to FIG. 5A and FIG. 6, the write driver 107, the first column decoder 102 and the memory cell array 101 are sequentially arranged in the positive X axis direction. It is to be noted that FIGS. 5A and 5B and FIG. 6 provide an internal arrangement mode in the memory. However, it is only exemplary, and the disclosure is not limited to the arrangement mode shown in FIGS. 5A and 5B and FIG. 6. The first column decoder 102, the write driver 107, the read amplifier 104, the memory cell array 101 and the second column decoder 103 are sequentially arranged in the first direction or arranged along other directions, which may also realize the disclosure.

When a write operation command is received, the write operation is performed on the memory cell array 101. The write driver 107 may perform the operation of writing data into the memory cells by means of the data input line (GIO). As shown in FIG. 5A, when the write operation is performed on the memory cell array 101, since the first column decoder 102 and the write driver 107 both transmit the first column selection signal and the data signal to be written to the memory cell array 101 along the same direction (e.g., the positive X axis direction in FIG. 5A), in the write process shown in FIG. 5A, timing of the first column selection signal and the data signal to be written may be kept substantially consistent, so that the consistency of the write operation is further improved.

Exemplarily, an input column address obtained by decoding the write operation command is transmitted to the first column decoder 102. The first column decoder 102 may decode the input column address and generate the first column selection signal based on a decoding result. The first column decoder 102 may transmit the first column selection signal along the positive X axis direction, so as to select the memory cell column corresponding to the input column address to perform the write operation.

In the embodiments of the disclosure, since the first column decoder 102 and the write driver 107 both transmit the column selection signal and the data signal to be written to the memory cell array 101 along the same direction (for example, the positive X axis direction in FIG. 5A), in the write process, timing of the column selection signal and the data signal to be written may be kept substantially consistent, thereby reducing the write errors, and improving the performance of the memory.

In some embodiments, the memory further includes a row decoder 108.

The row decoder 108 is coupled to the memory cell array 101, and the row decoder 108 and the memory cell array 101 are arranged in a third direction. The third direction is perpendicular to the first direction.

The row decoder 108 is configured to transmit a row selection signal 110 to the memory cell array 101, so as to select a memory cell row performing the write operation or the read operation in the memory cell array 101.

Exemplarily, the row decoder 108 may decode an input row address and may generate the row selection signal based on a decoding result. The row decoder 108 may transmit the row selection signal in the third direction (e.g., the negative Y axis direction shown in FIGS. 5A and 5B) by means of the word line, and may select the memory cells corresponding to the input row address.

Referring to FIGS. 5A and 5B and FIG. 6, the row decoder 108 and the memory cell array 101 are sequentially arranged along the third direction (e.g., the negative Y axis direction in FIGS. 5A and 5B). It is to be noted that FIGS. 5A and 5B and FIG. 6 provide an internal arrangement mode in the memory. However, it is only exemplary, and the row decoder 108 of the disclosure is not limited to the arrangement mode shown in FIGS. 5A and 5B and FIG. 6.

In some embodiments, the memory may include a DRAM.

It is to be noted that the memory may include the DRAM. The memory may further include other types of memories, for example, Static Random Access Memory (SRAM), a NAND flash, a NOR flash, a Resistive Random Access Memory (RRAM), a Ferroelectric Random Access Memory (FRAM), a Phase Change Random Access Memory (PRAM), a Thyristor Random Access Memory (TRAM) and a Magnetic Random Access Memory (MRAM). It is not limited in the disclosure.

Figure 8:
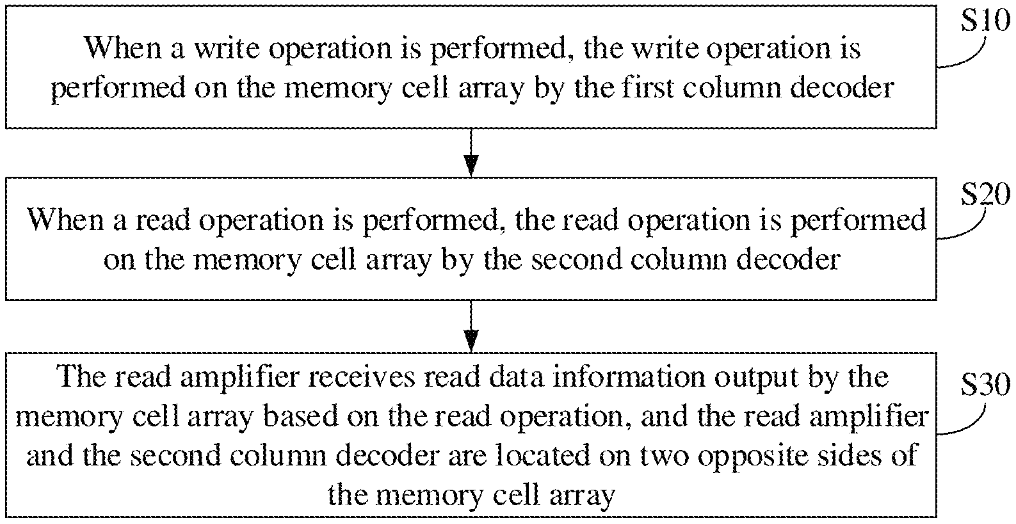
FIG. 8 is a schematic flowchart of an operating method for a memory according to an embodiment of the disclosure.

As shown in FIG. 8, FIG. 8 is a schematic flowchart of an operating method for a memory according to an embodiment of the disclosure. The memory may include a memory cell array, a first column decoder, a second column decoder and a read amplifier. The read amplifier, the first column decoder, the memory cell array and the second column decoder are arranged in a first direction, and the first column decoder and the second column decoder are located on two opposite sides of the memory cell array.

The operating method includes the following operations.

At S10, when a write operation is performed, the write operation is performed on the memory cell array by the first column decoder.

At S20, when a read operation is performed, the read operation is performed on the memory cell array by the second column decoder.

At S30, the read amplifier receives read data information output by the memory cell array based on the read operation. The read amplifier and the second column decoder are located on two opposite sides of the memory cell array.

It is to be noted that the memory may include the memory cell array, the first column decoder, the second column decoder and the read amplifier. The embodiment is illustrated by taking a condition that the read amplifier, the first column decoder, the memory cell array and the second column decoder shown in FIGS. 5A and 5B and FIG. 6 are sequentially arranged in the first direction as an example. In addition, the arrangement order of the read amplifier, the first column decoder, the memory cell array and the second column decoder in the first direction may be changed, which is not limited in the embodiment. The first column decoder 102, the read amplifier 104, the memory cell array 101 and the second column decoder 103 are sequentially arranged in the first direction or arranged along other directions, which may also realize the disclosure.

The operation in S10 is performed. When a write operation command is received, the write operation is performed on the memory cell array by the first column decoder. Specifically, an input column address obtained by decoding the write operation command is transmitted to the first column decoder. The first column decoder may decode the input column address and may generate the first column selection signal based on a decoding result. The first column decoder may transmit the first column selection signal along the positive X axis direction, so as to select the memory cell column corresponding to the input column address to perform the write operation.

Exemplarily, as shown in FIG. 5A, when the write operation is performed on the memory cell array 101, since the first column decoder 102 and the write driver 107 both transmit the column selection signal and the data signal to be written to the memory cell array 101 along a same direction (e.g., the positive X axis direction in FIG. 5A), in the write process shown in FIG. 5A, timing of the column selection signal and the data signal to be written may be kept substantially consistent, so that the consistency of the write operation is further improved.

The operation in S20 is performed. When a read operation command is received, the read operation is performed on the memory cell array 101 by the second column decoder. Specifically, an input column address obtained by decoding the read operation command is transmitted to the second column decoder. The second column decoder may decode the input column address and may generate the second column selection signal based on a decoding result. The memory cell column corresponding to the input column address is selected according to the second column selection signal to perform the read operation.

In an example, referring to FIG. 5B, the second column decoder 103 may transmit the second column selection signal along the direction (the negative X axis direction) opposite to the positive X axis direction, so as to select the memory cell column corresponding to the input column address, and the read operation is performed on the memory cell 101*a* determined according to the memory cell column in combination with the memory cell row corresponding to an input row address. As shown in FIG. 5B, the signal line with an arrow in FIG. 5B illustrates that the second column decoder 103 transmits the second column selection signal to the memory cell 101*a* along the direction (the negative X axis direction) opposite to the positive X axis direction, and the memory cell 101*a* outputs the read data to the read amplifier 104 along the direction (the negative X axis direction) opposite to the positive X axis direction according to the second column selection signal.

In another example, referring to FIG. 6, the second column decoder 103 may transmit the second column selection signal along the direction (the negative X axis direction) opposite to the positive X axis direction, so as to select the memory cell column corresponding to the input column address, and the read operation is performed on the memory cell 101*b* determined according to the memory cell column in combination with the memory cell row corresponding to an input row address. As shown in FIG. 6, the signal line with an arrow in FIG. 6 illustrates that the second column decoder 103 transmits the second column selection signal to the memory cell 101*b* along the direction (the negative X axis direction) opposite to the positive X axis direction, and the memory cell 101*b* outputs the read data to the read amplifier 104 along the direction (the negative X axis direction) opposite to the positive X axis direction according to the second column selection signal.

Referring to FIG. 5B and FIG. 6, when the read operation is performed on the memory cell array 101, for the memory cell 101*a* and the memory cell 101*b* with different distances from the second column decoder 103 in the memory cell array 101, the times taken for the processes of outputting read data to the read amplifier 104 are substantially the same.

In the memory provided by the embodiments of the disclosure, when a write operation is performed, the write operation is performed on the memory cell array by the first column decoder. When a read operation is performed, the read operation is performed on the memory cell array by the second column decoder. The read amplifier receives read data information output by the memory cell array based on the read operation. The read amplifier and the second column decoder are located on the two opposite sides of the memory cell array. Since the read amplifier and the second column decoder are located on the two opposite sides of the memory cell array, when data information of the memory cells at different positions is read and transmitted to the read amplifier respectively by means of the second column decoder, the above processes take approximately the same or even the same time, so as to avoid the read errors caused due to the reduced slack for receiving the data information by the subsequent circuit, thereby improving the performance of the memory.

In some embodiments, the memory may further include a command decoder. The operating method further includes the following operations.

When the write operation is performed, the command decoder controls the first column decoder to perform the write operation according to a received write operation command.

When the read operation is performed, the command decoder controls the second column decoder to perform the read operation according to a received read operation command.

Exemplarily, in response to a command (CMD) and an address (ADD) received from the external of the memory 100, the command (CMD) decoder may control the first column decoder, the second column decoder and the row decoder.

In an example, in response to the write operation command, the command decoder may control the first column decoder, and may transmit the input column address to the first column decoder. Therefore, the first column decoder 102 may also be referred to as a "write operation column decoder".

In another example, in response to the read operation command, the command decoder may control the second column decoder, and may transmit the input column address to the second column decoder. Therefore, the second column decoder may also be referred to as a "read operation column decoder".

In an exemplary embodiment, in response to an activation command, a precharging command, a refresh command or the like, the command decoder may further control the row decoder, and may transmit an input row address to the row decoder.

In some embodiments, the memory may further include a first column selection line, and the first column selection line is coupled to the first column decoder and the memory cell array.

The operation that the write operation is performed on the memory cell array by the first column decoder may include the following operation.

The first column decoder transmits the first column selection signal by means of the first column selection line in the first direction, to select a memory cell column in the memory cell array for performing the write operation.

In an example, the column selection signals may be generated by the first column decoder 102 and the second column decoder 103. Exemplarily, referring to FIG. 5A, the first column decoder 102 may decode the input column address and may generate the first column selection signal based on a decoding result. The first column decoder 102 may transmit the first column selection signal in the first direction (e.g., the positive X axis direction shown in FIG. 5A) by means of the first column selection line 105, so as to select the memory cell column corresponding to the input column address. The first column decoder 102 may drive, select or activate the first column selection line 105 along the positive X axis direction. The number of the first column selection lines may be one or more. Each of the first column selection lines 105 may be connected with at least one bit line.

In another example, the column selection signals may be generated by the command decoder. For example, the command decoder may, in response to the write operation command, generate the first column selection signal, and transmit the first column selection signal to the first column decoder.

In some embodiments, the memory may further include a second column selection line, and the second column selection line is coupled to the second column decoder and the memory cell array.

The operation that the read operation is performed on the memory cell array by the second column decoder may include the following operation.

The second column decoder transmits the second column selection signal by means of the second column selection line in a second direction opposite to the first direction, to select a memory cell column in the memory cell array for performing the read operation.

In an example, the column selection signals may be generated by the first column decoder 102 and the second column decoder 103. Exemplarily, referring to FIG. 6, the second column decoder 103 may decode the input column address and may generate the second column selection signal based on a decoding result. The second column decoder 103 may transmit the second column selection signal in the second direction (e.g., the negative X axis direction shown in FIG. 6) by means of the second column selection line 106, so as to select the memory cell column corresponding to the input column address. The second column decoder 103 may drive, select or activate the second column selection line 106 along the negative X axis direction. The number of the second column selection lines may be one or more. Each of the second column selection lines 106 may be connected with at least one bit line.

In another example, the column selection signals may be generated by the command decoder. For example, the command decoder may further, in response to the read operation command, generate the second column selection signal and transmit the second column selection signal to the second column decoder.

It is to be noted that referring to FIGS. 5A and 5B and FIG. 6, the first column selection line 105 and the second column selection line 106 may be the same column selection line, and the column selection signals are respectively transmitted by means of the same column selection line during the read operation or the write operation.

In some embodiments, the memory cell array may include a first target memory cell and a second target memory cell located in a same column, and the first target memory cell is closer to the second column decoder than the second target memory cell.

The operation that the read operation is performed on the memory cell array by the second column decoder may include the following operations.

The second column decoder transmits the second column selection signal, to select the first target memory cell and the second target memory cell to perform the read operation.

During a first read period, the first target memory cell outputs first read data to the read amplifier according to the second column selection signal.

The read amplifier receives the first read data after a first read time since the second column decoder transmits the second column selection signal.

During a second read period, the second target memory cell outputs second read data to the read amplifier according to the second column selection signal.

The read amplifier receives the second read data after a second read time since the second column decoder transmits the second column selection signal.

The first read time and the second read time are the same.

Referring to FIGS. 5A and 5B and FIG. 6, the memory cell array 101 includes the first target memory cell 101*a* and the second target memory cell 101*b* located in a same column, and the first target memory cell 101*a* is closer to the second column decoder 103 than the second target memory cell 101*b*.

Referring to FIG. 5B and FIG. 7, the second column decoder 103 transmits the second column selection signal Ysel, which is transmitted to the first target memory cell 101*a* after the time t1. The first target memory cell 101*a* receives the second column selection signal (e.g., at the rising position of Ysel_A in FIG. 7) and outputs stored first read data (e.g., Gio_A in FIG. 7) after the time t2. The first read data is transmitted to the read amplifier 104 after the time t3. The read amplifier 104 receives the first read data (e.g., Gio_SA_A in FIG. 7).

Exemplarily, referring to FIG. 7, the read amplifier 104 receives the first read data after the first read time T1 since the second column decoder 103 transmits the second column selection signal. The first read time T1=t1+t2+t3.

Referring to FIG. 6 and FIG. 7, the second column decoder 103 transmits the second column selection signal Ysel, which is transmitted to the second target memory cell 101*b* after the time t4. The second target memory cell 101*b* receives the second column selection signal (e.g., at the rising position of Ysel_B in FIG. 7) and outputs stored second read data (e.g., Gio_B in FIG. 7) after the time t5. The second read data is transmitted to the read amplifier 104 after the time t6. The read amplifier 104 receives the second read data (e.g., Gio_SA_B in FIG. 7).

Exemplarily, referring to FIG. 7, the read amplifier 104 receives the second read data after the second read time T2 since the second column decoder 103 transmits the second column selection signal. The second read time T2=t4+t5+t6.

Referring to FIG. 5B to FIG. 7, when the read operation is performed on the memory cell array 101, the first target memory cell 101*a* and the second target memory cell 101*b* respectively output the read data to the read amplifier 104. The first read time T1 and the second read time T2 are the same. In the memory provided by the embodiments of the disclosure, even if the read operation is performed on different memory cells, the read times are the same, so as to avoid the read errors caused due to the reduced slack for receiving the data information by the subsequent circuit, thereby improving the consistency of the read operation and further improving the performance of the memory.

In some embodiments, the memory further includes a write driver. The write driver and the first column decoder are located on the same side of the memory cell array.

The operating method also includes the following operation.

The write driver transmits data signal to be written to the memory cell array according to the received write operation command.

Referring to FIGS. 5A and 5B and FIG. 6, the write driver 107, the first column decoder 102 and the memory cell array 101 are sequentially arranged in the positive X axis direction. It is to be noted that FIGS. 5A and 5B and FIG. 6 provide an internal arrangement mode in the memory. However, it is only exemplary, and the disclosure is not limited to the arrangement mode shown in FIGS. 5A and 5B and FIG. 6.

When a write operation command is received, the write operation is performed on the memory cell array 101. The write driver 107 may perform the operation of writing data into the memory cells by means of the data input line (GIO). As shown in FIG. 5A, when the write operation is performed on the memory cell array 101, since the first column decoder 102 and the write driver 107 both transmit the first column selection signal and the data signal to be written to the memory cell array 101 along a same direction (e.g., the positive X axis direction in FIG. 5A), in the write process shown in FIG. 5A, timing of the first column selection signal and the data signal to be written may be kept substantially consistent, so that the consistency of the write operation is further improved.

Exemplarily, an input column address obtained by decoding the write operation command is transmitted to the first column decoder 102. The first column decoder 102 may decode the input column address and may generate the first column selection signal based on a decoding result. The first column decoder 102 may transmit the first column selection signal in the positive X axis direction, so as to select the memory cell column corresponding to the input column address to perform the write operation.

In the embodiments of the disclosure, since the first column decoder 102 and the write driver 107 both transmit the column selection signal and the data signal to be written to the memory cell array 101 along the same direction (for example, the positive X axis direction in FIG. 5A), in the write process, timing of the column selection signal and the data signal to be written may be kept substantially consistent, thereby reducing the write errors, and improving the performance of the memory.

In some embodiments, the memory further includes a row decoder. The row decoder and the memory cell array are arranged in a third direction, and the third direction is perpendicular to the first direction.

The operating method also includes the following operation.

The row decoder transmits a row selection signal to the memory cell array, to select a memory cell row in the memory cell array for performing the write operation or the read operation.

Referring to FIGS. 5A and 5B and FIG. 6, the row decoder 108 may decode an input row address and may generate the row selection signal based on a decoding result. The row decoder 108 may transmit the row selection signal in the negative Y axis direction by means of the word line, and may select the memory cells corresponding to the input row address.

Exemplarily, referring to FIGS. 5A and 5B and FIG. 6, the row decoder 108 and the memory cell array 101 are sequentially arranged along the third direction (e.g., the negative Y axis direction in FIGS. 5A and 5B). It is to be noted that FIGS. 5A and 5B and FIG. 6 provide an internal arrangement mode in the memory. However, it is only exemplary, and the row decoder 108 of the disclosure is not limited to the arrangement mode shown in FIGS. 5A and 5B and FIG. 6.

It is to be understood that “an embodiment” or “some embodiments” mentioned in the whole specification means that specific features, structures or characteristics related to the embodiment are included in at least one embodiment of the disclosure. Therefore, “in an embodiment” or “in some embodiments” used in the whole specification does not always refer to the same embodiment. In addition, these specific features, structures or characteristics may be combined in one or more embodiments freely as appropriate. It is to be understood that, in each embodiment of the disclosure, a magnitude of a sequence number of each process does not mean an execution sequence and the execution sequence of each process should be determined by its function and an internal logic and should not form any limit to an implementation process of the embodiments of the disclosure. The sequence numbers of the embodiments of the disclosure are adopted not to represent superiority-inferiority of the embodiments but only for description.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure.

What is claimed is:

1. A memory, comprising:
- a memory cell array;
- a first column decoder, coupled to the memory cell array and configured to perform a write operation on the memory cell array;
- a second column decoder, coupled to the memory cell array and configured to perform a read operation on the memory cell array; and
- a read amplifier, the read amplifier and the second column decoder being located on two opposite sides of the memory cell array, the read amplifier being coupled to the memory cell array and configured to receive read data information outputted by the memory cell array based on the read operation;
- wherein the read amplifier, the first column decoder, the memory cell array and the second column decoder are arranged in a first direction, and the first column decoder and the second column decoder are located on two opposite sides of the memory cell array;
- wherein the memory cell array comprises a first target memory cell and a second target memory cell located in a same column, the first target memory cell being closer to the second column decoder than the second target memory cell;
- the second column decoder is configured to transmit a second column selection signal, to select the first target memory cell and the second target memory cell to perform the read operation;

the first target memory cell is configured to output, during a first read period, first read data to the read amplifier according to the second column selection signal;

the read amplifier is further configured to receive the first read data after a first read time since the second column decoder transmits the second column selection signal;

the second target memory cell is configured to output, during a second read period, second read data to the read amplifier according to the second column selection signal;

the read amplifier is further configured to receive the second read data after a second read time since the second column decoder transmits the second column selection signal;

wherein the first read time and the second read time are the same.

2. The memory according to claim 1, further comprising:

a command decoder, coupled to the first column decoder and configured to control the first column decoder to perform the write operation according to a received write operation command;

wherein the command decoder is coupled to the second column decoder and further configured to control the second column decoder to perform the read operation according to a received read operation command.

3. The memory according to claim 1, further comprising;

a first column selection line, coupled to the first column decoder and the memory cell array and configured to transmit a first column selection signal to the memory cell array in the first direction, wherein the first column selection signal is used to select a memory cell column in the memory cell array for performing the write operation; and a second column selection line, coupled to the second column decoder and the memory cell array and configured to transmit a second column selection signal to the memory cell array in a second direction opposite to the first direction, wherein the second column selection signal is used to select a memory cell column in the memory cell array for performing the read operation.

4. The memory according to claim 1, further comprising: a write driver, wherein the write driver and the first column decoder are located on a same side of the memory cell array, and the write driver is configured to transmit a data signal to be written to the memory cell array according to a received write operation command.

5. The memory according to claim 1, further comprising:

a row decoder, coupled to the memory cell array, the row decoder and the memory cell array being arranged in a third direction, the third direction being perpendicular to the first direction;

wherein the row decoder is configured to transmit a row selection signal to the memory cell array, to select a memory cell row performing the write operation or the read operation in the memory cell array.

6. The memory according to claim 1, wherein the memory comprises a dynamic random access memory.

7. An operating method for a memory, comprising:

performing, by a first column decoder in the memory in a case where a write operation is performed, the write operation on a memory cell array in the memory;

performing, by a second column decoder in the memory in a case where a read operation is performed, the read operation on the memory cell array; and receiving, by a read amplifier in the memory, read data information output by the memory cell array based on the read operation, wherein the read amplifier, the first column decoder, the memory cell array and the second column decoder is arranged in a first direction, the first column decoder and the second column decoder is located on two opposite sides of the memory cell array, and the read amplifier and the second column decoder are located on two opposite sides of the memory cell array;

wherein performing, by the second column decoder in the memory, the read operation on the memory cell array comprises:

transmitting, by the second column decoder, a second column selection signal, to select a first target memory cell and a second target memory cell in the memory to perform the read operation, wherein the first target memory cell is closer to the second column decoder than the second target memory cell;

outputting, by the first target memory cell during a first read period, first read data to the read amplifier according to the second column selection signal;

receiving, by the read amplifier, the first read data after a first read time since the second column decoder transmits the second column selection signal;

outputting, by the second target memory cell during a second read period, second read data to the read amplifier according to the second column selection signal; and receiving, by the read amplifier, the second read data after a second read time since the second column decoder transmits the second column selection signal;

wherein the first read time and the second read time are the same.

8. The operating method for a memory according to claim 7, further comprising:

in the case where the write operation is performed, controlling, by a command decoder in the memory, the first column decoder to perform the write operation according to a received write operation command; and in the case where the read operation is performed, controlling, by the command decoder, the second column decoder to perform the read operation according to a received read operation command.

9. The operating method for a memory according to claim 7, wherein performing, by the first column decoder in the memory, the write operation on the memory cell array in the memory comprises:

transmitting, by the first column decoder, a first column selection signal through a first column selection line in the memory in the first direction, to select a memory cell column in the memory cell array for performing the write operation;

wherein the first column selection line is coupled to the first column decoder and the memory cell array.

10. The operating method for a memory according to claim 7, wherein performing, by the second column decoder in the memory, the read operation on the memory cell array comprises:

transmitting, by the second column decoder, a second column selection signal through a second column selection line in the memory in a second direction opposite to the first direction, to select a memory cell column in the memory cell array for performing the read operation;

wherein the second column selection line is coupled to the second column decoder and the memory cell array.

11. The operating method for a memory according to claim 7, further comprising:

transmitting, by a write driver in the memory, a data signal to be written to the memory cell array according to a received write operation command;

wherein the write driver is located on the same side of the memory cell array as the first column decoder.

12. The operating method for a memory according to claim 7, further comprising:

transmitting, by a row decoder in the memory, a row selection signal to the memory cell array, to select a memory cell row in the memory cell array for performing the write operation or the read operation;

wherein the row decoder and the memory cell array are arranged in a third direction, the third direction being perpendicular to the first direction.

* * * * *